(12) United States Patent
Chang et al.

(10) Patent No.: US 8,236,697 B2
(45) Date of Patent: Aug. 7, 2012

(54) METHOD FOR MANUFACTURING SEMICONDUCTOR DEVICE

(75) Inventors: Dong Sook Chang, Pyeongtaek-si (KR); Hyoung Soon Yune, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 1098 days.

(21) Appl. No.: 12/134,041

(22) Filed: Jun. 5, 2008

(65) Prior Publication Data

US 2009/0026584 A1 Jan. 29, 2009

(30) Foreign Application Priority Data

Jul. 27, 2007 (KR) .................. 10-2007-0075591

(51) Int. Cl.
*H01L 21/311* (2006.01)
(52) U.S. Cl. ........ 438/696; 438/671; 438/694; 438/703; 438/717; 438/736; 438/738
(58) Field of Classification Search .................. None
See application file for complete search history.

(56) References Cited

U.S. PATENT DOCUMENTS

| 2006/0163677 | A1* | 7/2006 | Heo et al. ................ 257/410 |
| 2006/0189080 | A1* | 8/2006 | Lee et al. ................ 438/261 |
| 2006/0273456 | A1* | 12/2006 | Sant et al. ................ 257/734 |
| 2008/0057692 | A1* | 3/2008 | Wells et al. .............. 438/597 |
| 2008/0113483 | A1* | 5/2008 | Wells ...................... 438/424 |

FOREIGN PATENT DOCUMENTS

| KR | 10-2002-0024936 | 4/2002 |
| KR | 10-2005-0002513 | 1/2005 |
| KR | 10-2008-0024053 | 3/2008 |

* cited by examiner

*Primary Examiner* — Lan Vinh
*Assistant Examiner* — Jiong-Ping Lu
(74) *Attorney, Agent, or Firm* — Marshall, Gerstein & Borun LLP

(57) ABSTRACT

A method for manufacturing a semiconductor device which includes fine patterns having various critical dimensions (CDs) by adjusting a thickness of spacer used as an etching mask in Spacer Patterning Technology (SPT). The method for manufacturing a semiconductor device includes forming spacers at a different level over an etching target layer and etching the etching target layer exposed among the spacers.

16 Claims, 6 Drawing Sheets

METHOD FOR MANUFACTURING SEMICONDUCTOR DEVICE

CROSS-REFERENCE TO RELATED APPLICATION

The priority of Korean patent application number 10-2007-0075591, filed on Jul. 27, 2007, the disclosure of which is incorporated by reference in its entirety, is claimed.

BACKGROUND OF THE INVENTION

The invention relates generally to a method for manufacturing a semiconductor device and, more particularly, to a method for manufacturing a semiconductor device through Spacer Patterning Technology (SPT) based on Multi Exposure Technology (MET).

In general, a process of producing semiconductor devices includes separate processes of fabrication, electrical die sorting, assembly, test, and so forth.

The fabrication process includes procedures for manufacturing a semi-manufactured product which is formed as electric circuits by repeatedly going through diffusion, photoresist patterning, etching, and deposition processes, which may be carried completely in the wafer state.

The electrical die sorting process begins after the fabrication process. The electrical die sorting process sorts out bad chips through a test of the electrical characteristics of each chip in the wafer state.

Meanwhile, as the degree of integration of semiconductor devices has increased, the size and pitch of patterns that form circuits have been reduced. According to Rayleigh's equation, the size of a fine pattern in a semiconductor device is in proportion to the wavelength of light used in the photo lithography process and is in inverse proportion to the size of the lens used in such a process. Thus, methods for reducing the wavelength of light used in the photo lithography or enlarging the size of lens have been used to reduce size and pitch of fine patterns.

In addition, as semiconductor devices have become highly-integrated, it would be necessary for manufacturing apparatus to operate beyond performance and capacity limits. In order to overcome technical limits of the manufacturing equipment, numerous methods have been attempted. For example, the amount of light, e.g. laser, injected into a semiconductor wafer through a reticle or a mask has been adjusted or controlled by designing the reticle or the mask to be finer in size. Also, researching of new photosensitive materials useful for pattern masks, development of scanners having a high numerical aperture lens, and development of deformed masks which contain a plurality of patterns in abnormal shapes have been attempted.

However, it is no longer possible to form desired width and pitch of fine patterns in a photo lithography process using the currently available light sources, e.g., KrF and ArF. For instance, currently developed photo lithography can form fine patterns having a size of at least about 60 nm on a semiconductor wafer, but there is much difficulty in making patterns having a size of less than 60 nm.

Thus, various studies have been conducted of processes to form finer photo resist patterns, made through the photo lithography, for using an etching mask during a process of etching an etch target layer in order to form finer patterns over the semiconductor wafer.

One such process is Double Patterning to form a pattern by using photo resist patterns made through carrying out photo lithography twice as an etching mask, and another is a Spacer Patterning Technology (SPT) to form a pattern by using a spacer. Generally, a spacer formed on sidewalls of various patterns in a semiconductor device has a thickness of from 20 nm to 30 nm. The spacer patterning technology using such spacers as an etching mask can form finer patterns than the double patterning using photo resist patterns as an etching mask, because it is possible that the spacers have smaller size than the photo resist patterns. A conventional spacer patterning technology explained in detail below.

FIGS. 1a to 1e are cross-sectional views illustrating a conventional method for manufacturing a semiconductor device having a fine pattern through SPT.

Referring to FIG. 1a, a photoresist film is coated on an etching target layer 2. Then, a photomask is aligned with the etching target layer, and ultraviolet (UV) light is injected through windows in the photomask to form a photoresist pattern 4. This is generally called an exposure step. Through the exposure step, a photoresist exposed by a photomask becomes soluble and can be easily removed by the developer chemical used in a developing process Typically, the developing process includes a soft bake step, a wet etch developing step, and a hard bake step.

Referring to FIGS. 1b and 1c, after a spacer 6 is form on sidewalls of the photoresist pattern 4, and the photoresist pattern 4 is removed.

Referring to FIGS. 1d and 1e, the etching target layer 2 is etched by using the spacer 6 as an etching mask, and the spacer 6 is removed. Here, the critical dimension (CD) of a fine pattern 8 is determined by the thickness of the spacer 6. That is, the fine pattern 8 has the same CD to the thickness of the spacer 6.

However, in the conventional SPT described above, it is impossible for the thickness of the spacers formed on sidewalls of photoresist patterns to be different from each other. Thus, all spacers have the substantially same thickness, thereby being unable to form fine patterns having variable sizes.

BRIEF SUMMARY OF THE INVENTION

Various embodiments of the invention are directed at providing a method for manufacturing a semiconductor device which includes fine patterns having various critical dimensions (CDs) by adjusting a thickness of spacer used as an etching mask in Spacer Patterning Technology (SPT) based on Multi Exposure Technology (MET).

According to an embodiment of the invention, a method for manufacturing a semiconductor device comprises forming spacers at different levels and etching an etching target layer exposed among the spacers.

Preferably, the spacers at a lower level are thicker than those at a higher level.

Preferably, forming the spacers at different levels comprises stacking sacrificial patterns at the different levels and affixing a new spacer on both a sacrificial pattern at the highest level and existing spacers at a lower level.

Preferably, the new spacer is formed on sidewalls of sacrificial patterns at the highest level and affixed on an outer side of the existing spacers.

Preferably, the spacer and the sacrificial patterns have different etching selectivities.

Preferably, the sacrificial pattern comprises a photoresist layer, an oxide layer, a nitride layer, a metal layer, or a combination thereof.

Preferably, the etching target layer is a semiconductor substrate.

Preferably, stacking the spacers at different levels comprises forming a first sacrificial pattern over the etching target layer, forming a first spacer on sidewalls of the first sacrificial pattern, forming a second sacrificial pattern over the first sacrificial pattern, forming a second spacer on sidewalls of the second sacrificial pattern and an outer side of the first spacer, and removing the first and the second sacrificial patterns except for portions of the first sacrificial pattern covered by the second spacer.

Preferably, central axes of the first and the second sacrificial patterns are aligned.

Preferably, the first sacrificial pattern is formed on the etching target layer, and the second sacrificial pattern is formed on the first sacrificial pattern.

Preferably, stacking the spacers at different levels further comprises forming an interlayer between the first sacrificial pattern and the etching target layer or between the second sacrificial pattern and the first sacrificial pattern.

Preferably, etching an etching target layer comprises removing the first and second spacers and the portions of the first sacrificial pattern covered by the second spacer.

Preferably, each spacer formed by a deposition process and an etch-back process has a thickness below 30 nm.

According to another embodiment of the invention, a semiconductor device comprises a plurality of patterns including more than two values of width, wherein a half of the plurality of patterns and the other half are symmetrically arranged with respect to each other.

According to another embodiment of the invention, a method for fabricating a semiconductor device comprises forming a first spacer on sidewalls of a first pattern on an etching target layer; simultaneously forming a second spacer on sidewalls of a second pattern on the first pattern and a third spacer on sidewalls of the first spacer; and, etching the etching target layer by using the first to the third spacers as an etching mask.

Preferably, the method for fabricating a semiconductor device further comprises removing the second pattern.

Preferably, forming a first spacer and forming a second spacer and a third spacer are performed repeatedly.

Preferably, the first pattern is larger in size than the second pattern.

In one embodiment, the second pattern comprises a plurality of sub patterns of identical size In another embodiment, the second pattern comprises a plurality sub patterns of different sizes.

Preferably, the etching target layer is a semiconductor substrate, a reticle, or a mask.

Preferably, the first and the second patterns respectively comprise a photoresist layer, an oxide layer, a nitride layer, a metal layer, or a combination thereof.

DESCRIPTION OF EMBODIMENTS

Hereinafter, the invention will be described in detail with reference to the accompanying drawings.

The invention relates to a technology which can be used fabricate a semiconductor device comprising a plurality of patterns having various sizes by adjusting a thickness of spacers in Spacer Patterning Technology (SPT) based on Multi Exposure Technology (MET).

FIGS. 2a to 2e are cross-sectional views illustrating a method for manufacturing a semiconductor device according to an embodiment of the invention.

Figure 2A:
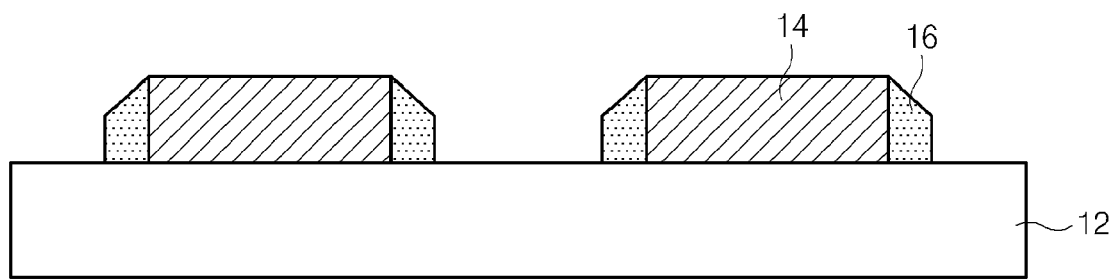
FIGS. 2a to 2e are cross-sectional views illustrating a method for manufacturing a semiconductor device according to an embodiment of the invention.

Referring to FIG. 2a, an oxide layer as a sacrificial layer is deposited on an etching target layer 12, and a first oxide pattern 14 is formed through photo lithography. Then, a first spacer 16 is formed on sidewalls of the first oxide pattern 14. Here, the etching target layer 12 is illustratively a semiconductor substrate or a hard mask layer. Also, the invention can be applied to make a reticle or a mask, if necessary.

Figure 2B:
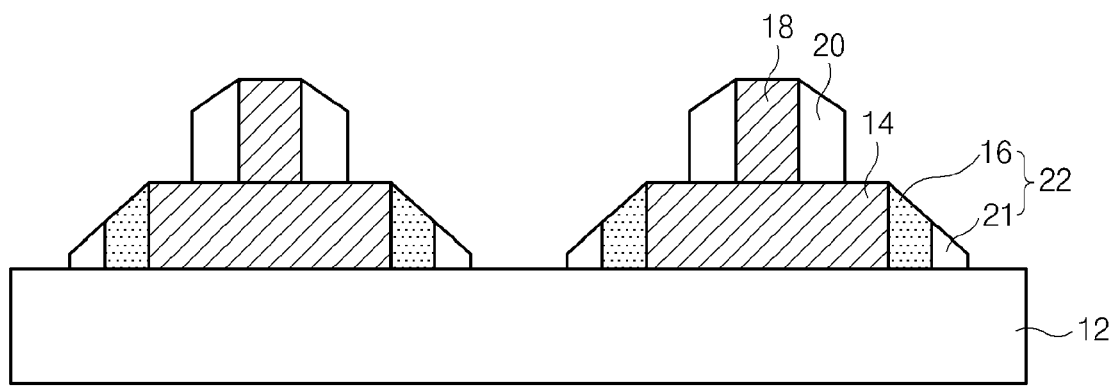

Referring to FIG. 2b, an oxide film is deposited on a structure including the first oxide film pattern 14 and the first spacer 16 over the etching target layer 12, and photo lithography is performed to form a second oxide pattern 18. According to one embodiment of the invention, the second oxide pattern 18 is directly formed on the first oxide pattern 14; however, according to another embodiment of the invention, it is possible to form a buffer film, a support film, an anti reflection coating film, or an etching stop film between the first oxide pattern 14 and the second oxide pattern 18, thereby improving accuracy of forming each oxide pattern having a different level, not the same level.

In a conventional method, according to the pitch and size of circuit patterns in the semiconductor device, the second oxide pattern may be formed at the same level between the first oxide patterns 14 or within a certain area requiring each different size of patterns. However, in the invention, the second oxide pattern 18 is formed on the first oxide pattern 14.

In addition, FIGS. 2a to 2b shows that the first oxide pattern 14 and the second oxide pattern 18 are constituted with an oxide layer. However, in another embodiment of the invention, each of the first and the second oxide patterns 14 and 18 includes at least one of a nitride layer or a metal film. If necessary, the first and second oxide patterns 14 and 18 can be formed with a photoresist layer. It is mandatory that, material used for the first oxide pattern 14 and the second oxide pattern 18, respectively, have different etching selectivities from that of the material used for the first spacer 16.

Then, a spacer 20 is formed on sidewalls of the second oxide pattern 18 and simultaneously a third spacer 21 is additionally formed on outer sidewalls of the first spacer 16. At this time, the thickness of an expanded spacer 22 including the first spacer 16 and the third spacer 21 should be substantially equal to the sum of the thicknesses of the first spacer 16 and the second spacer 20; however, due to the slope of the first spacer 16, the thickness of the third spacer 21 is different from that of the second spacer 20. If the first oxide pattern 14 and the second oxide pattern 18 have sufficiently height above the etch target layer 12, limitation to the thicknesses of the first to the third spacers 16, 10, and 21 because of their slopes can be overcome.

For example, if the thickness which can be formed through one spacer forming step is 30 nm, a double spacer such as the expanded spacer 22, including the first and the third spacers 16 and 21, fabricated by embodiments of the invention can have a thickness of 60 nm. In this case, it is possible to form a gate pattern having a width of 60 nm neighboring to a gate pattern having a width of 30 nm, i.e., to form gate patterns having a different size from each other in a neighboring position.

Figure 2C:
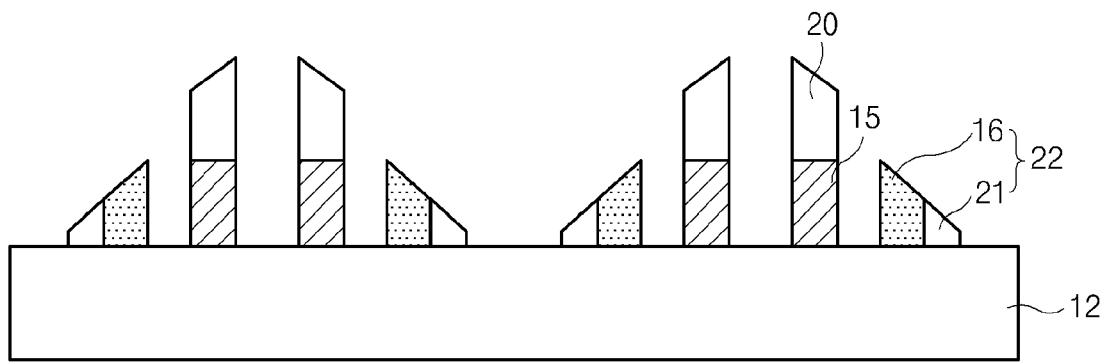

Referring to FIG. 2c, an exposed portion of the first oxide pattern 14 and the second oxide pattern 18 are removed. At this time, since the first oxide pattern 14 is etched by using the second spacer 20 as an etching mask, the third oxide pattern 15 under the second spacer 20 is left.

Figure 1A:
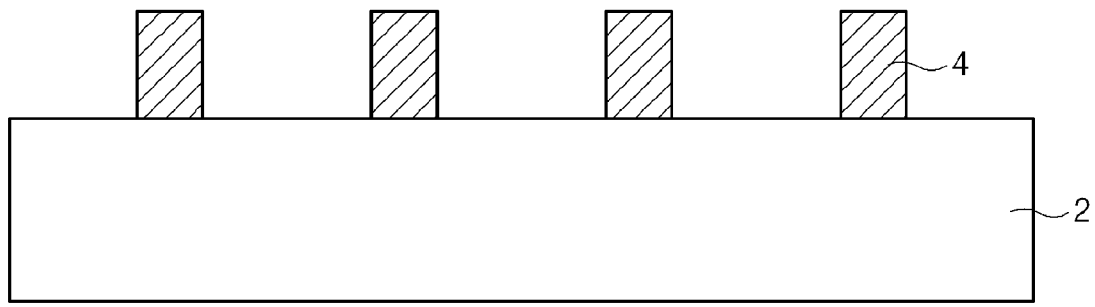
FIGS. 1a to 1e are cross-sectional views illustrating a conventional method for manufacturing a semiconductor device having a fine pattern through SPT.
Figure 1B:
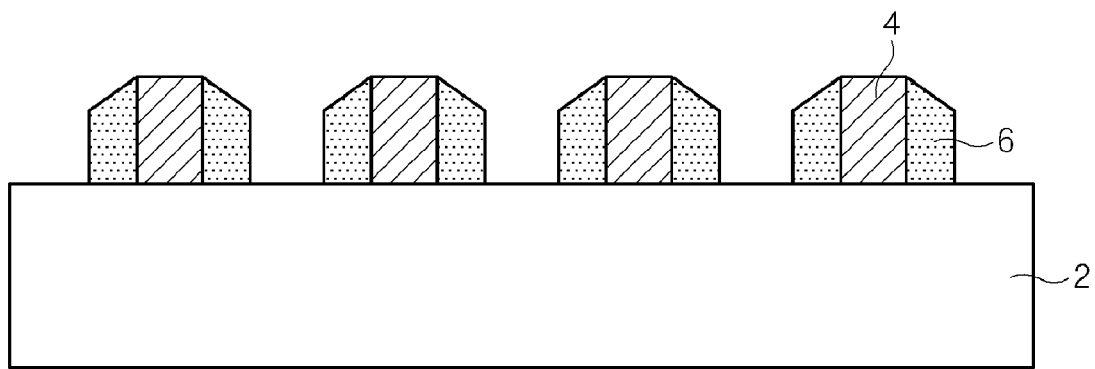
Figure 1C:
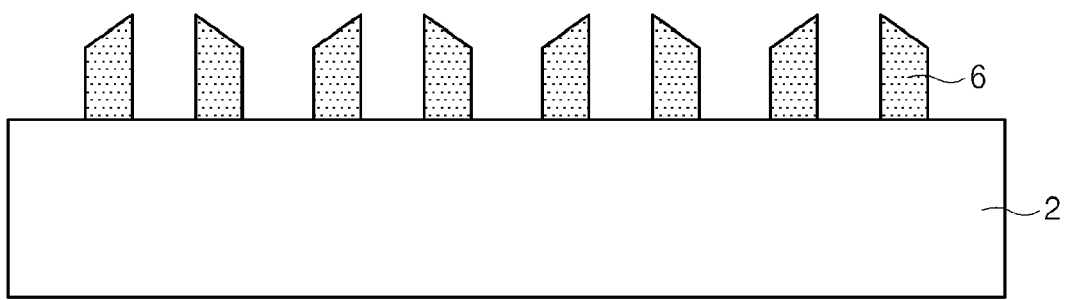
Figure 1D:
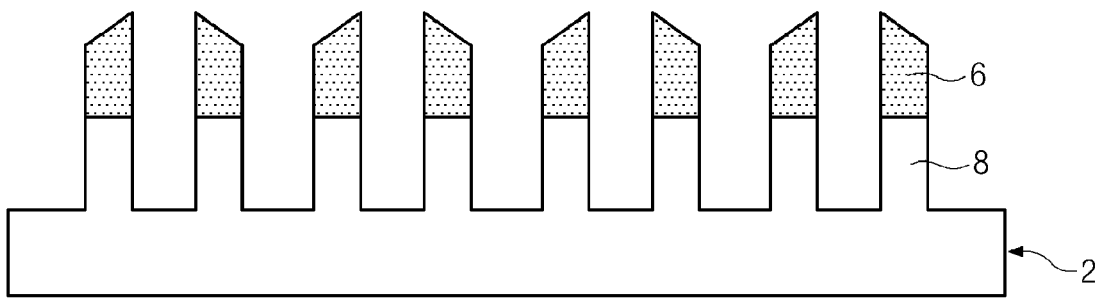
Figure 1E:
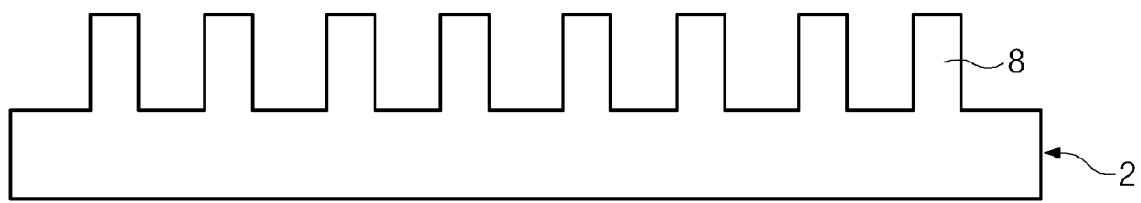
Figure 2D:
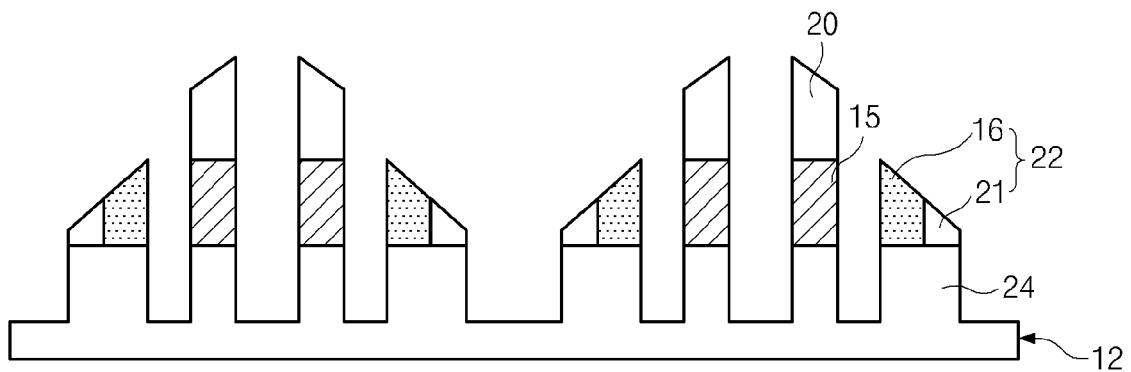

Referring to FIG. 2d, the second spacer 20 and the expanded spacer 22 including the first spacer 16 and the third spacer 21 are used as etching masks to etch the etching target layer 12 and form a fine pattern 24. Such a fine pattern 24 can have a different size and pitch, as compared with the fine patterns 8, shown in FIG. 1e, made by a conventional method. In addition, the invention makes it possible to form the fine pattern 24 symmetrically about the central axes of the first oxide pattern 14 and the second oxide pattern 18. On the other hand, if the central axis of each oxide pattern, i.e., the first oxide pattern 14 and the second oxide pattern 18, is not matched with each other, it is also possible to make the pitch of the subsequently formed patterns differently.

Figure 2E:
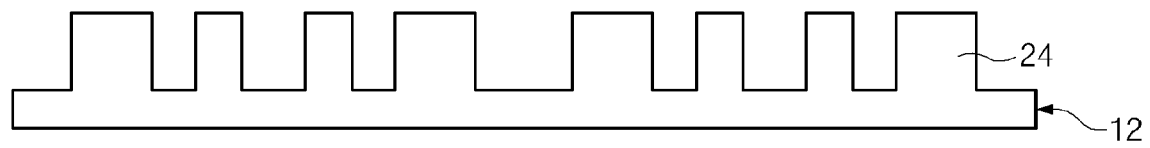

Referring to FIG. 2e, the third oxide pattern 15, the first spacer 16, the second spacer 20, and the third spacer 21 are removed.

The foregoing embodiment of the invention gives an example of the case adjusting the thickness of the spacer through double photo lithography; however, when a larger etching target layer pattern is required, Spacer Patterning Technology (SPT) by Multi Exposure Technology (MET) which is carried out more than twice can be used to adjust the thickness of a spacer and form an etching target layer pattern having a desired size.

As described above, through Spacer Patterning Technology (SPT) based on Multi Exposure Technology (MET), the invention can control the critical dimension (CD) of fine patterns in a semiconductor device by adjusting the thickness of the spacer.

Furthermore, when the oxide film pattern having each different size is formed at the same level on the etching target layer, not on a stacking layer, it inevitably has gate patterns having the substantially same size in semiconductor device. However, the invention can vary the size and density of adjacent gate patterns by stacking oxide patterns having each different size and forming spacers on sidewalls of a structure including the oxide patterns over an etching target layer whenever each oxide pattern is formed.

In the invention, a structure of stacking a upper oxide pattern over a lower oxide pattern can form a symmetrical pattern by the center axis of the upper and lower oxide patterns. Since semiconductor devices often include gate patterns repeated in the inner part or symmetrical patterns by predetermined areas or lines, the symmetry of the gate patterns or the symmetrical patterns can be improved when an STI process according to the invention is carried out by using spacers formed on stacked oxide patterns of which the central axis are matched and size and pitch are determined depending upon the type of the gate or the symmetrical patterns.

Meanwhile, in case of determining positions of stacked oxide patterns in response to a pitch of asymmetrical patterns in a semiconductor device, it is possible to form fine patterns, each having different pitch and size, by the invention. Especially, as shown in the invention, the semiconductor device including fine patterns formed by spacers on sidewalls of stacked oxide patterns can be more high-integrated than that formed by a double patterning using a plurality patterns having each different pitch at the same level.

One embodiment of the invention shows that single second oxide pattern 18 is formed over the first oxide film pattern 14; however, in another embodiment of the invention, it is possible to form a upper oxide pattern formed of plural sub patterns over a lower oxide pattern. For example, a cell string of a flash memory device comprises plural control-gate patterns and relatively bigger connection-gate patterns at both ends of the plural control-gate patterns. Such control-gate and connection-gate patterns can be formed by forming spacers over plural small-sized sub sacrificial patterns (e.g., oxide patterns) over one sacrificial pattern and using the spacers as an etching mask. Here, the plural sub sacrificial patterns can be formed in the same size or each different size, depending upon the size and structure of circuit patterns in a semiconductor device.

Further, as the invention uses a stacking structure of sacrificial patterns, it is unnecessary to split a semiconductor device into plural areas according to the size and position of fine circuit patterns and shift one to another area for forming fine circuit patterns having various sizes in each area. Thus, a shifting step including opening or closing some area in the semiconductor device is needless and, then, whole fabrication process of the semiconductor device is simplified.

The above embodiments of the invention are illustrative and not limiting. Various alternatives and equivalents are possible. The invention is not limited by the type of deposition, etching polishing, and patterning steps describe herein, nor is the invention limited to any specific type of semiconductor device. For example, the invention may be implemented in a dynamic random access memory (DRAM) device or non volatile memory device. Other additions, subtractions, or modifications are intended to fall within the scope of the appended claims.

What is claimed is:

1. A method for manufacturing a semiconductor device, comprising:
   forming a first sacrificial pattern over the etching target layer;
   forming a first spacer on sidewalls of the first sacrificial pattern;
   forming a second sacrificial pattern over the first sacrificial pattern;
   forming a second spacer on sidewalls of the second sacrificial pattern and an outer side of the first spacer; and
   removing the first and the second sacrificial patterns except for portions of the first sacrificial pattern covered by the second spacer; and
   etching the etching target layer exposed among the spacers, wherein the spacers at the first sacrificial pattern are thicker than those at the second sacrificial pattern.

2. The method according to claim 1, wherein the first and second spacers and the sacrificial patterns have different etching selectivities.

3. The method according to claim 1, wherein the first and second sacrificial patterns are selected from the group consisting of photoresist layers, oxide layers, nitride layers, metal layers, and combinations thereof.

4. The method according to claim 1, wherein the etching target layer is a semiconductor substrate.

5. The method according to claim 1, wherein central axes of the first and second sacrificial patterns are aligned.

6. The method according to claim 1, comprising forming the first sacrificial pattern on the etching target layer, and forming the second sacrificial pattern on the first sacrificial pattern.

7. The method according to claim 1, wherein stacking spacers at different levels further comprises forming an interlayer between the first sacrificial pattern and the etching target layer or between the second sacrificial pattern and the first sacrificial pattern.

8. The method according to claim 1, wherein etching an etching target layer comprises removing the first and the second spacers and the portions of the first sacrificial pattern covered by the second spacer.

9. The method according to claim 1, wherein each spacer once formed by a deposition process and an etch-back process has a thickness below 30 nm.

10. A method for fabricating a semiconductor device, comprising:
   forming a first spacer on sidewalls of a first pattern on an etching target layer;
   simultaneously forming a second spacer on sidewalls of a second pattern on the first pattern and a third spacer on sidewalls of the first spacer;
   removing the second pattern; and,
   etching the etching target layer by using the first to the third spacers as an etching mask.

11. The method according to claim 10, wherein forming a first spacer and forming a second spacer and a third spacer are performed repeatedly.

12. The method according to claim 10, wherein the first pattern is larger in size than the second pattern.

13. The method according to claim 12, wherein the second pattern comprises a plurality of sub patterns of identical size.

14. The method according to claim 12, wherein the second pattern comprises a plurality of sub patterns of different sizes.

15. The method according to claim 10, wherein the etching target layer is selected from the group consisting of semiconductor substrates, reticles, and masks.

16. The method according to claim 10, wherein the first and the second patterns are selected from the groups consisting of photoresist layers, oxide layers, nitride layers, metal layers, and combinations thereof.

* * * * *